United States Patent

[11] 3,582,940

[72] Inventor Gunnar Axel Kihlberg
Sollentuna, Sweden
[21] Appl. No. 682,051
[22] Filed Nov. 13, 1967
[45] Patented June 1, 1971
[73] Assignee Jungner Instrument Aktiebolag
Stockholm, Sweden
[32] Priority Nov. 18, 1966
[33] Sweden
[31] 15830/66

[54] ANALOGUE-TO-DIGITAL CONVERTER
2 Claims, 2 Drawing Figs.

[52] U.S. Cl. .......... 340/347AD
[51] Int. Cl. .......... H03k 13/20
[50] Field of Search .......... 340/347

[56] References Cited
UNITED STATES PATENTS 2,963,697 12/1960 Giel .......... 340/347
3,261,012 7/1966 Bentley .......... 340/347
3,303,493 2/1967 Charbonnier .......... 340/347
3,351,873 11/1967 Kimura .......... 340/347
3,276,012 9/1966 Secretan .......... 340/347

*Primary Examiner*—Maynard R. Wilbur
*Assistant Examiner*—Charles D. Miller
*Attorney*—Fred C. Philpitt

ABSTRACT: An analog-to-digital converter is disclosed which is capable of handling, in time-multiplexed fashion, a number of analog input signals. A code generator generates a frame of pulses which include all possible digital outputs. Each analog signal is compared with comparison reference voltage which is synchronized in time with the code generator output. A differential amplifier produces a pulse which commences when the comparison voltage and analog signal are equal in magnitude. This pulse is then utilized to select the correct digital output, from the frame of pulses generated by the code generator, which corresponds to the magnitude of the analog signal.

ANALOGUE-TO-DIGITAL CONVERTER

Conversion of an analogue electrical quantity, e.g. a DC voltage, to a digital value does often take place according to the following principle. Upon arrival of the unknown analogue signal a comparison voltage is generated and a counter is started. The comparison voltage has constant slope and when it has reached the same value as that of the analogue signal, the counter is stopped. Accordingly, the principle could be described as measurement of the time necessary for the comparison voltage to reach the level of the analogue signal. The resolving power of such a system equals the smallest unit of the counter and the accuracy depends on the time coordination in the moments of starting and stopping and of the comparison waveform. It is only possible to examine one analogue voltage at a time with the aid of each counter and comparison waveform.

In order to generate a digital information concerning the rotational position of a rotatable member it has been suggested instead of a linear comparison voltage to utilize a multiphase alternating voltage synchronized with a counter operating in a stationary mode and generating code voltages corresponding to the digital values. The multiphase alternating voltage generates a magnetic flux rotating in synchronism with the frequency of a voltage and the instantaneous direction of which corresponds to the code voltages. In an output winding there is induced an alternating voltage the phase angle of which is determined by the rotational position of said rotatable member. As is understood, the net output is a sinusoidal voltage the phase angle of which is displaced in proportion to the rotational angle of the rotatable member. That voltage does, when passing the zero level, trigger a readout pulse which reads the code voltages supplied by the counter.

The object of the present invention is to utilize the principle above described for the purpose of converting DC voltage signals to digital values and to effect that conversion so that all the disadvantages inherent in the prior art systems are eliminated. In accordance with the main characteristics of the invention substantially each instantaneous value of the comparison voltage corresponds to a predetermined digital value from the counter, the pulse-duration-modulated voltage being, after selection and synchronization, fed into said buffer memory and the digital value supplied by the counter in the shift point being stored or recorded in the buffer memory.

Figure 1:
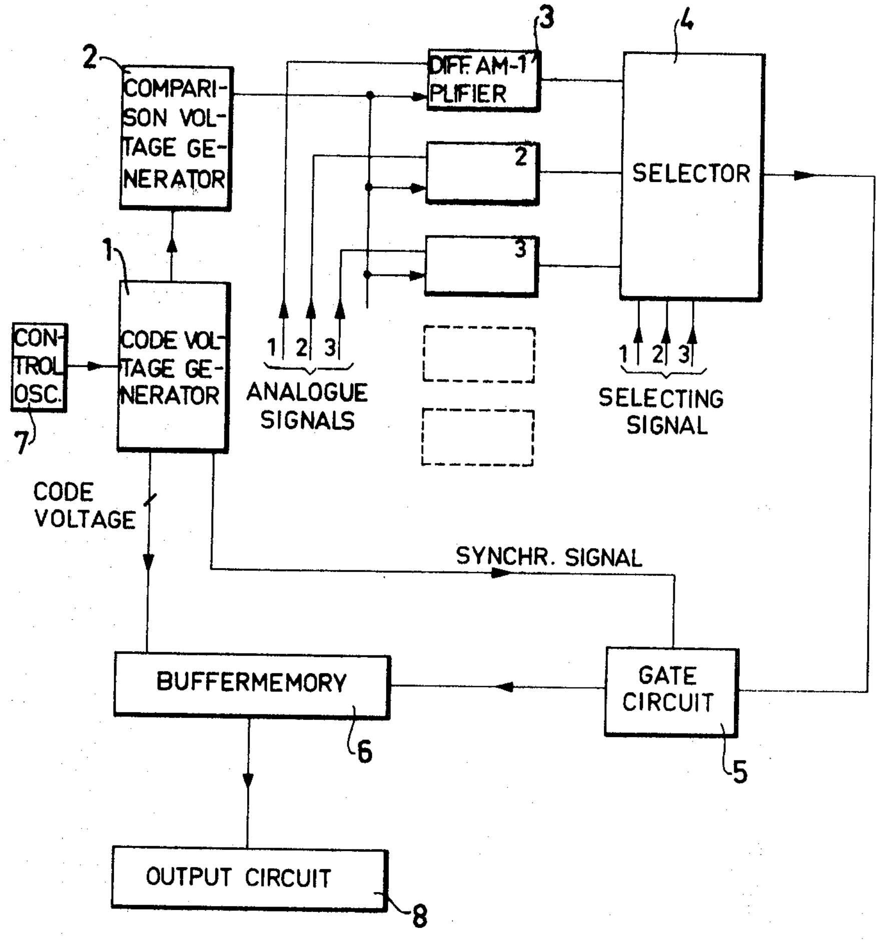
Figure 2:
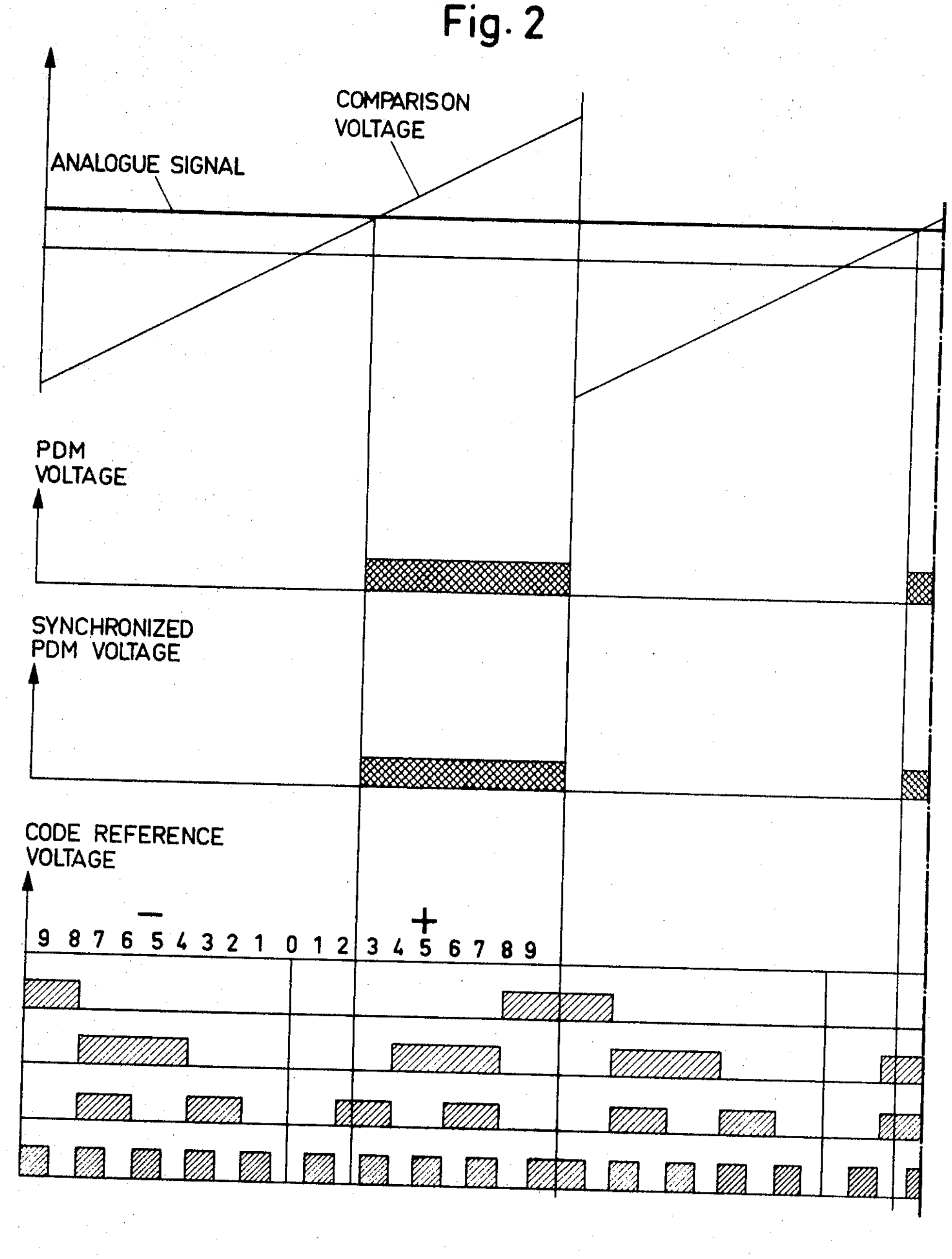

The invention will not be described in greater detail, reference being made to the accompanying drawings which illustrate a special embodiment and in which:

FIG. 1 is a block circuit diagram showing an analogue-to-digital converter according to the invention, FIG. 2 illustrates the relation in time between the comparison voltage, the pulse-duration-modulated voltage, the synchronized pulse-duration-modulated voltage and the code reference voltage. Reference numeral 1 designates a code voltage generator, i.e. a counter which during one period counts up and down, e.g. from zero to nine and then back to zero, during completely stationary and periodic cycles. A generator 2 is operating in synchronism with generator 1 and delivers a comparison voltage, the general waveform of which is a sawtooth curve or a triangular curve. As appears from FIG. 2, the comparison voltage is according to the selected embodiment of the invention a pure sawtooth voltage. It will be understood that in the present case generator 2 supplies a voltage of constant slope because the test signal is constituted by a DC voltage. However, the comparison waveform may also be nonlinear which can be attained by superimposition upon the linear voltage of a nonlinear modifying voltage which design takes care of certain periodically appearing systematic nonlinear phenomena in the generator. Such phenomena occur in resistor generators where the current does not vary linearly but has a current-voltage characteristic which is slightly curved due to the influence of the temperature. It is fully possible to use such a characteristic for modifying the linear comparison waveform.

Each point on the comparison waveform corresponds to a defined digital value from the counter, excepting those points on the comparison waveform in which the code voltages are transient. According to the invention analogue signals are supplied to the one input of an individual differential amplifier 3 whereas the comparison waveform is fed into the second input of amplifier 3. The output voltage from each amplifier is accordingly constituted by a pulse-duration-modulated voltage (PDM voltage) the initial point of which is defined by the intersection between the test signal and the comparison waveform. Accordingly, the output voltage from the differential amplifier may assume either of two discrete voltage levels. By means of a selector 4 it is possible to arbitrarily select any of the PDM voltages from the differential amplifier and to pass it on to a gate circuit 5 and to a buffer memory 6. The object of circuit 5 is to prevent generation of a PDM voltage in any of those points which do not correspond to a clearly defined code voltage. This is attained in the following manner. Should the initial point of the pulse coincide with any of the transient points, the starting point of the PDM voltage is displaced, by reason of the lack of a synchronizing signal from the code generator until such time as the comparison waveform corresponds to the digital signals generated by the code generator. When the PDM voltage has reached the buffer memory 6 the code reference voltages are supplied to the memory and in the output circuit 8 the voltages are interpreted in any convenient manner and presented either visually on a screen or recorded on a tape etc. It is an important feature of the invention that one differential amplifier 3 is allotted to each analogue signal for conversion thereof to a pulse-duration-modulated voltage. Since the output voltages from the amplifiers can but assume either of two discrete levels, it is possible to utilize a very simple design for selector 4. By way of example, it may be constituted by diode gates. Selecting signals fed into the selector provides selection of a desired output voltage for conversion into digital shape. In that way the analogue signals are sampled in a most reliable and rapid manner. To have one differential amplifier for each analogue signal is advantageous also because it allows continuous supply of the analogue signals to the amplifier and accurate filtering of those signals for noise elimination. It is thus feasible to filter each signal and individually to adjust its bandwidth before it reaches the amplifier, which is of very great value in comparison to the prior art systems, where the different signals are supplied to a common differential amplifier successively and in a predetermined order.

FIG. 2 illustrates the relation in time between the various voltages. The basic pulse-duration-modulated voltage is formed in the intersection between the analogue signal and the sawtooth voltage and remains until the instantaneous value of the sawtooth voltage falls below the level of the analogous signal. FIG. 2 illustrates the case that the initial point of the PDM voltage corresponds to digital number 2. The initial point is discretely defined and the synchronized PDM voltage does accordingly agree with the original PDM voltage. For that reason buffer memory 6 will store or record digital number 2. During the next period another digital number will be supplied into the buffer memory in response to the position of the point of intersection between the analogous voltage and the sawtooth voltage.

According to an alternative embodiment of the invention it is possible simultaneously to obtain a digital recording of several analogue signals in which case each differential amplifier is connected to a gate circuit with a buffer memory. Stated in other words, the memory must have such a large capacity that it can simultaneously absorb digital values corresponding to several sampling stations. If a very great number of such stations are to be sampled simultaneously it is preferable to use a core memory designed as a two-dimensional coincidence memory. One of the coordinates corresponds to the analogous value and the input pulses are supplied in parallel. The other coordinate is the digital value and the code reference voltages are also supplied in parallel.

What I claim is:

1. An analogue-to-digital converter comprising a code voltage generator, said code voltage generator comprising a digital counter counting continuously up and down in periodic cycles and producing a combination of output code voltages representing the digital count of the counter, a comparison voltage generator producing a cyclic comparison voltage of substantially constant slope, said comparison voltage generator being synchronized with said code voltage generator so that the instantaneous value of said comparison voltage corresponds to a predetermined combination of code voltages, a plurality of differential amplifiers each having one input connected to receive said comparison voltage delivered by said comparison voltage generator, another input connected to receive an analog signal to be converted to digital form, each of said differential amplifiers producing a pulse commencing when said comparison voltage and said analog signal are equal, selector means to pass only one of said pulses to a memory, means for connecting the output of said code voltage generator to said memory, and means connecting the output of said selector means to said memory, which operates to store the digital count of said counter, corresponding to the starting point of said one pulse, said last-named means including a gate circuit operative to pass said one pulse to said memory when the output of said code voltage generator is significant and when said comparison voltage and said analog signal are equal.

2. An analogue-to-digital converter comprising, a code voltage generator producing in time sequence a frame of digital output signals corresponding to all of the possible digital outputs, a comparison voltage generator synchronized with said code voltage generator producing a comparison voltage of substantially constant slope, a plurality of differential amplifiers, means for applying said comparison voltage to each of said differential amplifiers, means for applying a plurality of analog signals to said plurality of differential amplifiers, said means applying each of said plurality of analog signals to one of said plurality of differential amplifiers, each of said differential amplifiers producing a pulse commencing when said comparison voltage and said analog signal are equal, a memory, means for applying the output of said code voltage generator to said memory, selector means to pass only one of said pulses to a gating means, said gating means enabled by said one pulse for storing in said memory the digital output of said code voltage generator when said pulse commences, said gating means receiving a synchronizing signal from said code voltage generator, said gating means passing said one pulse only when said digital output signals are significant and when said comparison voltage and said analog signal are equal.